(12) United States Patent
Xie

(10) Patent No.: US 10,705,372 B2
(45) Date of Patent: Jul. 7, 2020

(54) LIQUID CRYSTAL DISPLAY PANEL AND DISPLAY DEVICE WITHOUT GRAY SCALE VOLTAGES

(71) Applicant: SHANGHAI TIANMA MICRO-ELECTRONICS CO., LTD., Shanghai (CN)

(72) Inventor: Ming Xie, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 128 days.

(21) Appl. No.: 15/951,332

(22) Filed: Apr. 12, 2018

(65) Prior Publication Data

US 2019/0227374 A1 Jul. 25, 2019

(30) Foreign Application Priority Data

Jan. 25, 2018 (CN) .......................... 2018 1 0071733

(51) Int. Cl.
| | | |
|---|---|---|
| *G02F 1/1335* | (2006.01) | |
| *H01L 29/786* | (2006.01) | |
| *G09G 3/00* | (2006.01) | |
| *G02F 1/1343* | (2006.01) | |
| *G02F 1/1362* | (2006.01) | |
| *G02F 1/1368* | (2006.01) | |

(52) U.S. Cl.
CPC .. *G02F 1/133514* (2013.01); *G02F 1/133553* (2013.01); *G09G 3/00* (2013.01); *H01L 29/786* (2013.01); *G02F 1/1368* (2013.01); *G02F 1/13439* (2013.01); *G02F 1/136286* (2013.01); *G02F 2001/134345* (2013.01); *G02F 2201/123* (2013.01); *G02F 2203/02* (2013.01)

(58) Field of Classification Search
CPC ... G02F 1/133514; G02F 2001/136222; G02F 2001/134345; G02F 1/136286; G02F 1/133553; G02F 2203/02
See application file for complete search history.

(56) References Cited

U.S. PATENT DOCUMENTS 9,151,997 B2 * 10/2015 Tamaki ............... G02F 1/13439
2016/0033813 A1 * 2/2016 Yoon ................. G02F 1/133514
349/108

FOREIGN PATENT DOCUMENTS

CN 107589610 A 9/2017

* cited by examiner

*Primary Examiner* — Paisley L Wilson
(74) *Attorney, Agent, or Firm* — Anova Law Group PLLC

(57) ABSTRACT

A liquid display panel, and a display device are provided. The liquid display panel includes a first substrate and a color filter layer. The first substrate includes a plurality of data lines and a plurality of scanning lines. The color filter layer includes a plurality of color-blockers. The data lines and the scanning lines intersect to form a plurality of pixels arranged in an array. Each pixel includes a first sub-pixel and a second sub-pixel adjacent to each other. Each first sub-pixel includes a first pixel electrode, and each second sub-pixel includes a second pixel electrode. The first sub-pixel and the second sub-pixel have an approximately same area. Each color-blocker corresponds to one of the pixels arranged in an array, and includes a first region and a second region, corresponding to the first sub-pixel and the second sub-pixel in a same pixel. The second region and the first region have a same color. The second region has a color-blocking region larger than a color-blocking region in the first region.

19 Claims, 14 Drawing Sheets

LIQUID CRYSTAL DISPLAY PANEL AND DISPLAY DEVICE WITHOUT GRAY SCALE VOLTAGES

CROSS-REFERENCES TO RELATED APPLICATION

This application claims the priority of Chinese Patent Application No. 201810071733.2, filed on Jan. 25, 2018, the content of which is incorporated by reference in its entirety.

TECHNICAL FIELD

The present disclosure generally relates to the field of display technologies and, more particularly, relates to a low-power-consumption liquid crystal display panel and a display device thereof.

BACKGROUND

With continuous developments in sciences and technologies, display devices with display functions have been more and more widely used in applications. Among the display devices, a color display can provide more information and better visual experiences to users than a black/white display. A liquid crystal display device usually uses color filters to form color images, i.e., uses a space color mixing principle to mix three primary colors.

In a conventional liquid display device, liquid crystals are placed between a first substrate and a second substrate, and two electrodes can generate an electrical field to drive electrical field effects of liquid crystal molecules. Correspondingly, a light source can be transmitted or blocked, and thus to display images. In comparison to a monochrome liquid crystal display device, a color liquid crystal display device further includes a color filter layer, i.e., a color-blocking layer. Every pixel usually includes three sub-pixels, corresponding to a red (R) color-blocking area, a Green (G) color-blocking area, and a Blue (B) color-blocking area in the color filter, respectively. A driving circuit provides red (R), green (G), and blue (B) signals of images, to drive corresponding sub-pixels respectively. A white light source can show different colors when the white light source passes through different color-blocking areas in the color filter, to display colorful images. Further, in a conventional red (R)-green (G)-blue (B) three-color liquid crystal display device, the driving circuit outputs different driving voltages to drive the liquid crystal display device to display different gray scales. Subsequently, different colors are displayed through different gray scales to accomplish a multi-color display. Four gray scale voltages are needed for a 64-color display, which has a high power-consumption. Lowering frequencies may be used to reduce the power consumption, but pixel current leakage effect may happen, causing an anomaly in displaying brightness of middle gray scales and an anomaly in colors of the images.

The disclosed display panel, and display device and pressure sensing method thereof are directed to solve one or more problems set forth above and other problems.

SUMMARY

One aspect of the present disclosure provides a liquid display panel. The display panel includes a first substrate and a color filter layer. The first substrate includes a plurality of data lines and a plurality of scanning lines. The color filter layer includes a plurality of color-blockers. The data lines and the scanning lines intersect to form a plurality of pixels arranged in an array. Each pixel includes a first sub-pixel and a second sub-pixel adjacent to each other. Each first sub-pixel includes a first pixel electrode, and each second sub-pixel includes a second pixel electrode. The second sub-pixel and the first sub-pixel have an approximately same area. Each color-blocker corresponds to one of the pixels arranged in an array, and includes a first region and a second region, corresponding to the first sub-pixel and the second sub-pixel in a same pixel. The second region has a color same as a color of the first region, and the second region has a color-blocking region larger than a color-blocking region in the first region.

Another aspect of the present disclosure provides a display device. The display device includes a liquid crystal display panel provided by any embodiments of the present disclosure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
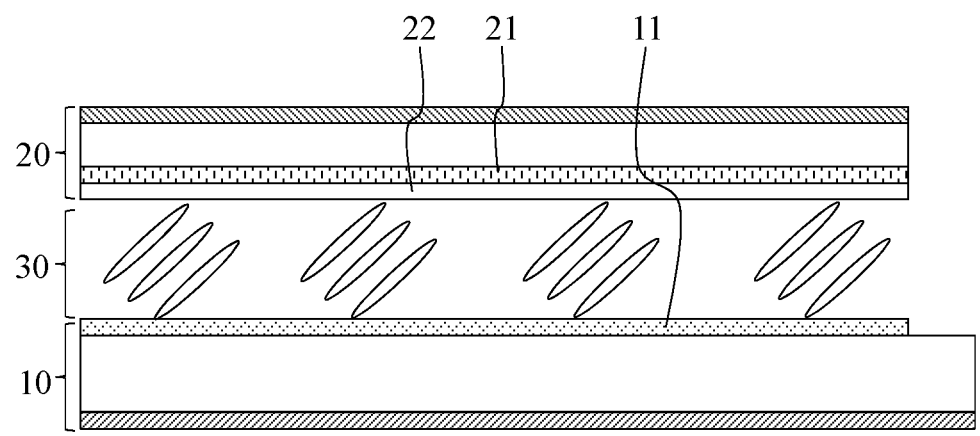
FIG. 1 illustrates an exemplary structure of a liquid display panel consistent with disclosed embodiments.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined when there is no conflict. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the invention. Furthermore, a three-dimensional size including length, width and depth should be considered during practical fabrication.

First, the present disclosure provides a liquid crystal display panel. FIG. 1 illustrates an exemplary structure of a liquid display panel consistent with disclosed embodiments. For illustration purposes, the present disclosure is described using a reflective liquid crystal display panel as an example. Correspondingly, the liquid crystal display panel in FIG. 1 is a reflective liquid crystal display panel and may include a first substrate 10, a second substrate 20, and a liquid crystal layer 30 between the first substrate 10 and the second substrate 20. The liquid crystal layer 30 may be sealed in a box-shaped space formed by the first substrate 10 and the second substrate 20.

Figure 2:
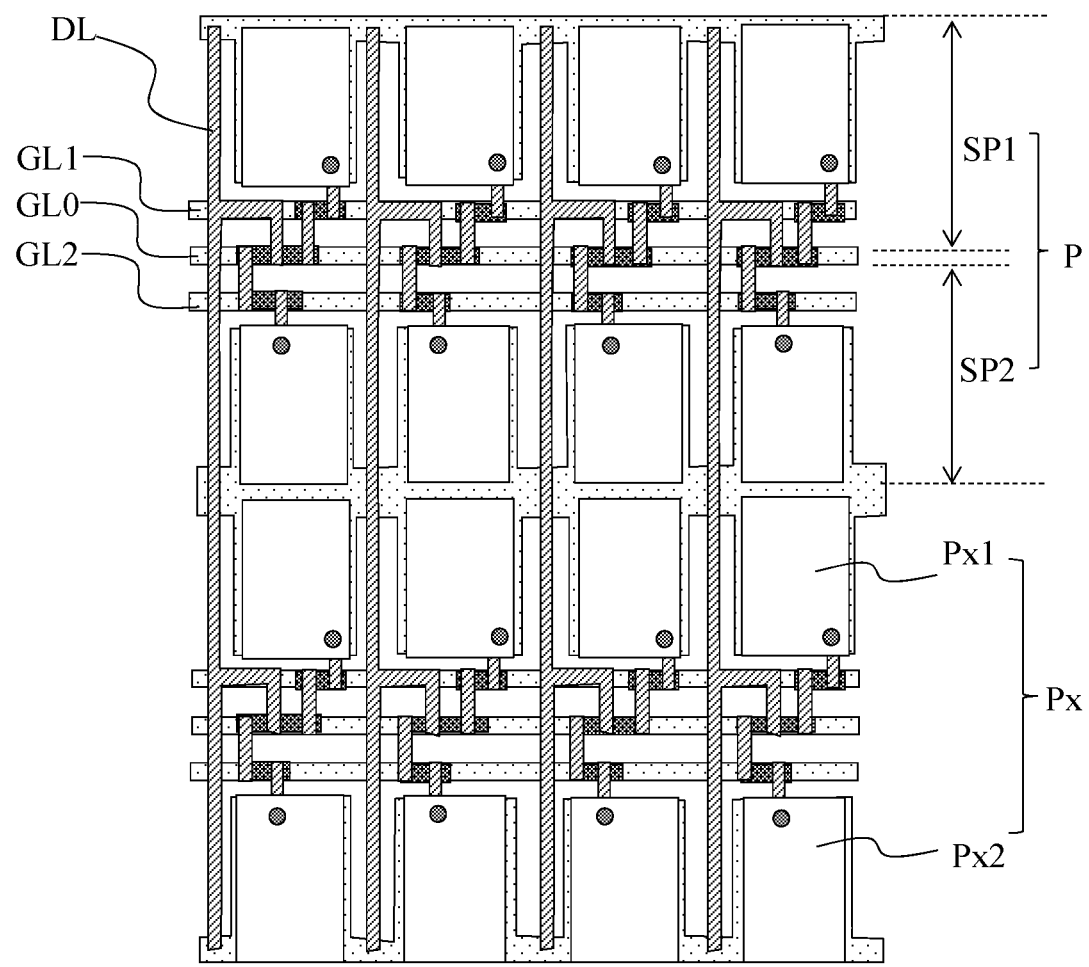
FIG. 2 illustrates an exemplary structure of a first substrate consistent with disclosed embodiments.
Figure 3:
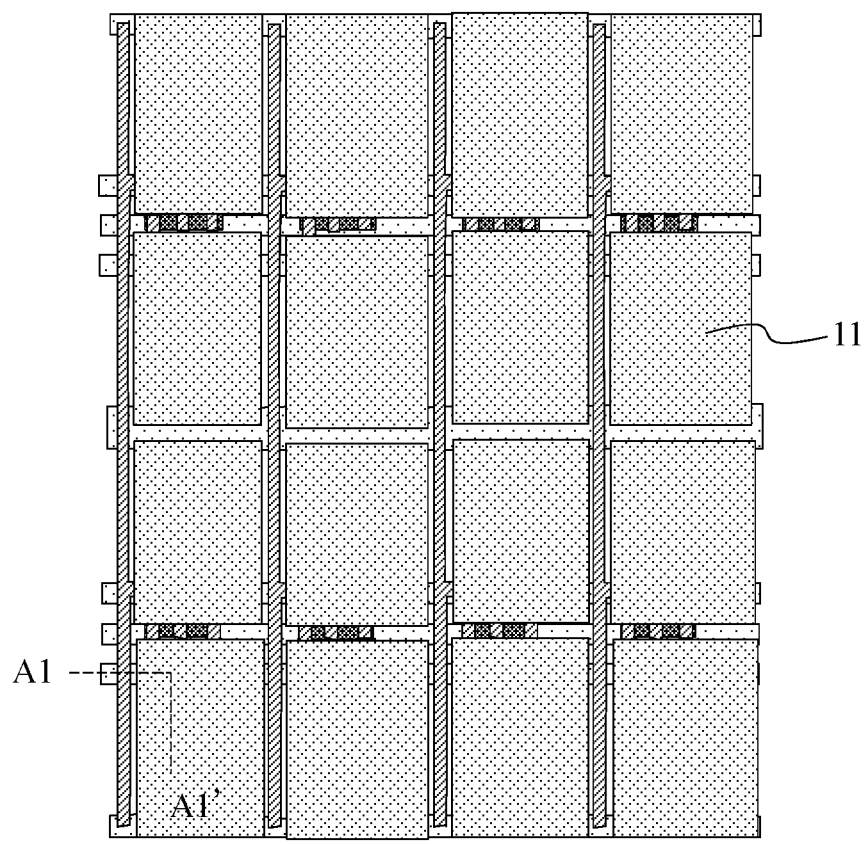
FIG. 3 illustrates an exemplary structure of a reflective metal layer consistent with disclosed embodiments.
Figure 4:
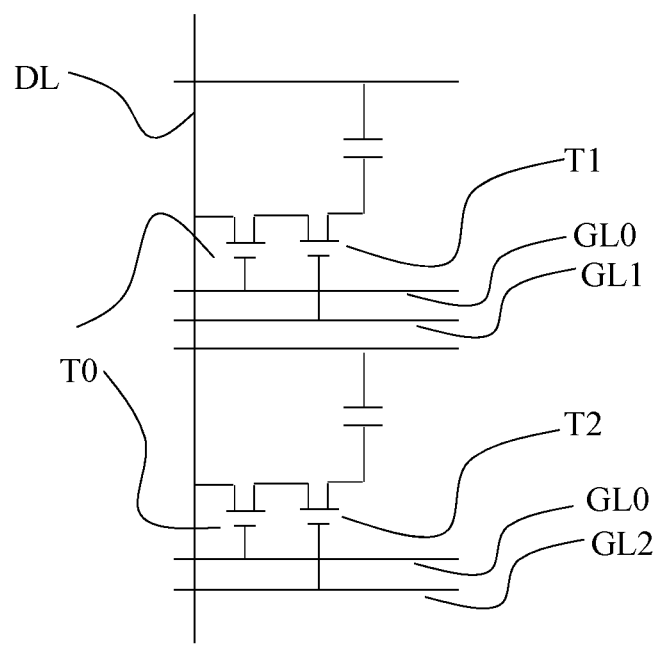
FIG. 4 illustrates an exemplary pixel driving structure in the first substrate consistent with disclosed embodiments.
Figure 5:
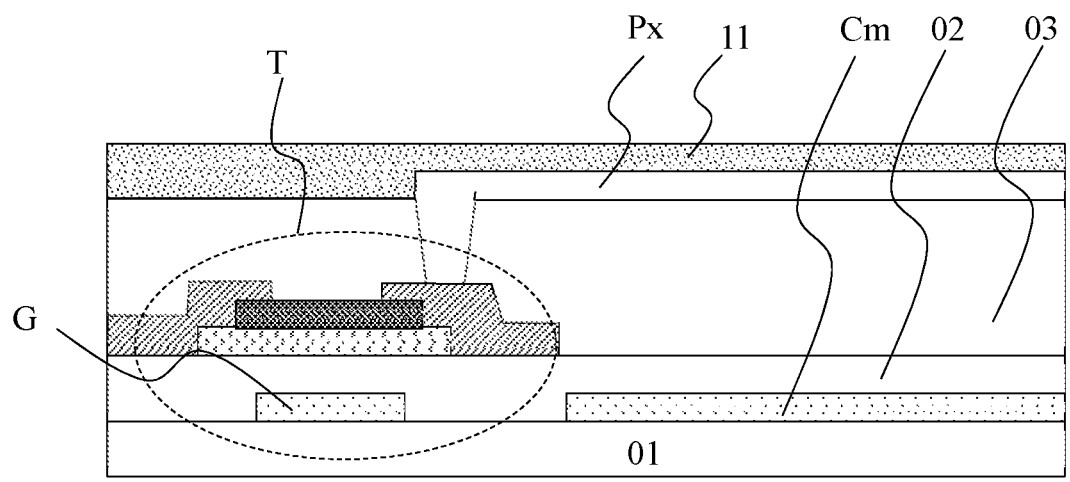
FIG. 5 illustrates a cross-section view along the A1-A1' direction in FIG. 3.

The first substrate 10 may have a structure illustrated in FIGS. 2-5. FIG. 2 illustrates an exemplary structure of the first substrate in the liquid crystal display panel provided by one embodiment of the present disclosure. FIG. 3 illustrates an exemplary structure of a reflective metal layer in the liquid crystal display panel provided by one embodiment of the present disclosure. FIG. 4 illustrates an exemplary pixel driving structure in the liquid crystal display panel provided by one embodiment of the present disclosure. FIG. 5 is a cross-sectional view of the first substrate along A1-A1' direction in FIG. 3.

The first substrate 10 may include a driving array on a base substrate. The driving array may include a plurality of data lines (DL) arranged in parallel and a plurality of scanning lines (GL) arranged in parallel. The data lines DL and the scanning lines GL may intersect each other to form a plurality of pixels (P) arranged in an array. Each pixel P may at least include a first sub-pixel SP1 and a second sub-pixel SP2 adjacent to each other. Each pixel P may include at least a scanning line GL, at least a data line DL, at least a switch device T, and at least a pixel electrode Px. Each pixel electrode Px may include a first pixel electrode Px1 and a second pixel electrode Px2 in the first sub-pixel SP1 and in the second sub-pixel SP2 respectively.

In one embodiment, the first sub-pixel SP1 and the second sub-pixel SP2 may be arranged along an extending direction of the data lines, in one pixel. Two pixel electrodes including the first pixel electrode Px1 and the second pixel electrode Px2, may be insulated from each other and be deployed in each pixel P. And the first pixel electrode Px1 and the second pixel electrode Px2 may be deployed in the first sub-pixel SP1 and in the second sub-pixel SP2 respectively. The second sub-pixel SP2 may have an area approximately same as an area of the first sub-pixel SP1, or the second sub-pixel SP2 may have an opening with an area approximately same as an opening of the first sub-pixel SP1. Correspondingly, an area of the second pixel electrode Px2 may be same as an area of the first pixel electrode Px1. When the first substrate has a transmission structure, the opening may be a light transmission region in the sub-pixels. When the first substrate has a reflective structure, the opening may be a reflective region in the sub-pixels. Or the opening may be a region to perform gray-scale displaying according to needs of displaying images.

In a certain embodiment, the first substrate has a reflective structure and may further include a reflective metal layer 11 to reflect externally incident natural lights to perform gray-scale display.

In one embodiment, the first pixel electrode Px1 and the second pixel electrode Px2 may be used together as the reflective metal layer 11. The pixel electrode may be formed by depositing vapor of reflective metal materials, such as aluminium and silver, or formed by compounds or alloys including aluminium or silver. The pixel electrode may have a reflective function and conductive function simultaneously. An area where the first pixel electrode Px1 and the second pixel electrode Px2 are located may be used as a reflection area, and a gray scale display may be realized by reflecting externally incident natural lights. In areas not covered by the pixel electrodes (the first pixel electrode Px1 and the second pixel electrode Px2), in gaps between the two adjacent sub-pixels (the first sub-pixels SP1 and the second sub-pixels SP2), and in spaces between the adjacent pixels, the pixel electrode may be insulated, and may have gaps with a certain width. The gaps between the pixel electrodes may not reflect lights and may form constantly dark areas, to be used as light shielding areas between adjacent pixels or sub-pixels and prevent color mixing between adjacent pixels or sub-pixels. It can also be considered that areas covered by the first pixel electrode Px1 and the second pixel electrode Px2 form openings of the first sub-pixels SP1 and the second sub-pixels SP2 respectively. Only the areas covered by the first pixel electrode Px1 and the second pixel electrode Px2 can reflect lights and perform gray scale display according to the needs of the displayed images.

In other embodiments, the reflective metal layer 11 may be formed additionally to provide the first substrate with reflective functions. For example, the pixel electrode (the first pixel electrode Px1 and the second pixel electrode Px2) may be made of transparent metal-oxide materials, such as InO2 and SnO2. The reflective metal layer 11 may be deposited on the pixel electrode layer. The reflective metal layer 11 may be formed by vapour depositing of reflective metal materials such as aluminium and silver, or compounds/alloys including aluminium or silver. The reflective metal layer 11 may or may not contact the pixel electrode directly. Subsequently, the reflective metal layer 11 may include a plurality of reflective metal blocks each of which corresponds to one sub-pixel. Gaps with an appropriate width between adjacent metal blocks may serve as light shielding areas between adjacent pixels or sub-pixels and prevent color mixing between adjacent pixels or sub-pixels. An area covered by each reflective metal block may serve as a reflective area to perform gray scale displaying by reflecting natural lights from outside and may form the opening for each sub-pixel.

In some embodiments, the reflective metal layer 11 may have a full-surface type when it is not in contact with the pixel electrodes. Other types may also be used.

In one embodiment, the first sub-pixel SP1 and the second sub-pixel SP2 of each pixel P may be arranged along an extending direction of the data lines and between two adjacent data lines. The scanning lines GL of each pixel may include a first scanning line GL1, a primary scanning line GL0, and a second scanning line GL2 sequentially, between the first sub-pixel SP1 and the second sub-pixel SP2.

A plurality of the switch devices T of each pixel may include a primary thin film transistor T0, a first thin film transistor T1 and a second thin film transistor T2. A gate of the primary thin film transistor T0 may be connected to the primary scanning line GL0, and a source of the primary thin film transistor T0 may be connected to the data line DL corresponding to the first sub-pixel SP1 and the second sub-pixel SP2 simultaneously. The primary thin film transistor T0 may include a first drain and a second drain. The first drain of the primary thin film transistor T0 may be connected to a source of the first thin film transistor T1, and the second drain of the primary thin film transistor T0 may be connected to a source of the second thin film transistor T2. A gate of the first thin film transistor T1 may be connected to the first scanning line GL1, and a source of the first thin film transistor T1 may be connected to the first drain of the primary thin film transistor T0. A drain of the first thin film transistor T1 may be connected to the first pixel electrode Px1 corresponding to the first sub-pixel SP1. A gate of the second thin film transistor T2 may be connected to the second scanning line GL2, and a source of the second thin film transistor T2 may be connected to the second drain of the primary thin film transistor T0. A drain of the second thin film transistor T2 may be connected to the second pixel electrode Px2 corresponding to the second sub-pixel SP2. The first substrate may drive the first sub-pixel SP1 through the primary thin film transistor T0 and the first thin film transistor T1, and may drive the second sub-pixel SP2 through the primary thin film transistor T0 and the second thin film transistor T2. The adjacent first sub-pixel SP1 and second sub-pixel SP2 may share the primary thin film transistor T0.

The primary thin film transistor T0, the first thin film transistor T1 and the second thin film transistor T2 may be a metal-oxide thin film transistor, such as an indium-gallium-zinc oxide (IGZO) thin film transistor.

Each metal-oxide thin film transistor may include a gate G formed in the base substrate 01, a gate insulating layer 02 on the gate G, an oxide source layer Y on the gate insulating layer 02, source S and drain D electrically connected to two ends of the oxide source layer Y. The metal-oxide thin film transistor may also include a contacting layer between the source/drain and the oxide source layer, and the source/drain may be connected to the oxide source layer through the contacting layer. A material of the contacting layer and a material of the oxide source layer may have a same composition The materials of the contacting layer and the oxide source layer may have different oxygen concentrations to make the contacting layer being conductive. The oxide source layer may be made of indium gallium zinc oxide (IGZO), and the gate insulating layer may be made of $SiO_2$. The metal oxide transistor has a large on-state current and a small off-state current. Correspondingly, the charge rate of the pixels in the liquid crystal display panel and the retention rate at low-frequency driving may be further improved, and the display effect can be enhanced.

In one embodiment, the driving array for each pixel may further include a storage electrode Cm. The storage electrode Cm may have overlapping portions with the pixel electrodes Px in the first sub-pixel SP1 and the second sub-pixel SP2, respectively, to form storage capacitances. The storage electrode Cm may be made of metals, alloys, metal nitrides, metal oxides, metal nitrogen oxides, stacking layers by metal materials and other conducting materials, or may be formed by an additional transparent conducting layer. In a driving process, the storage electrode Cm may have a common voltage by being connected to a common electrode through a common signal line.

In certain embodiments, the second sub-pixel SP2 may have an area same as an area of the first sub-pixel SP1, and formed liquid crystal capacitances may be same too. Further, the storage electrode Cm may be configured to make an overlapping area between the storage electrode Cm and the pixel electrode in the first sub-pixel SP1 same as an overlapping area between the storage electrode Cm and the pixel electrode in the second sub-pixel SP2. Correspondingly, the storage capacitance formed in the first sub-pixel SP1 and the second sub-pixel SP2 may be same. A display uniformity may be improved and flickering problems in a low-frequency driving may be avoided.

The second substrate 20 may include a color filter layer 21 and a common electrode 22 on the upper base substrate. The common electrode 22 may be located on one side of the color filter layer 21 away from the upper base substrate, and may cover the color filter layer 21. The color filter layer 21 may include a plurality of color blockers with different color, corresponding to different pixels. Each color blocker may include different regions, corresponding to different sub-pixels in each pixel. In various embodiments, the color filter layer may be deployed on the first substrate or on the second substrate.

Figure 6:
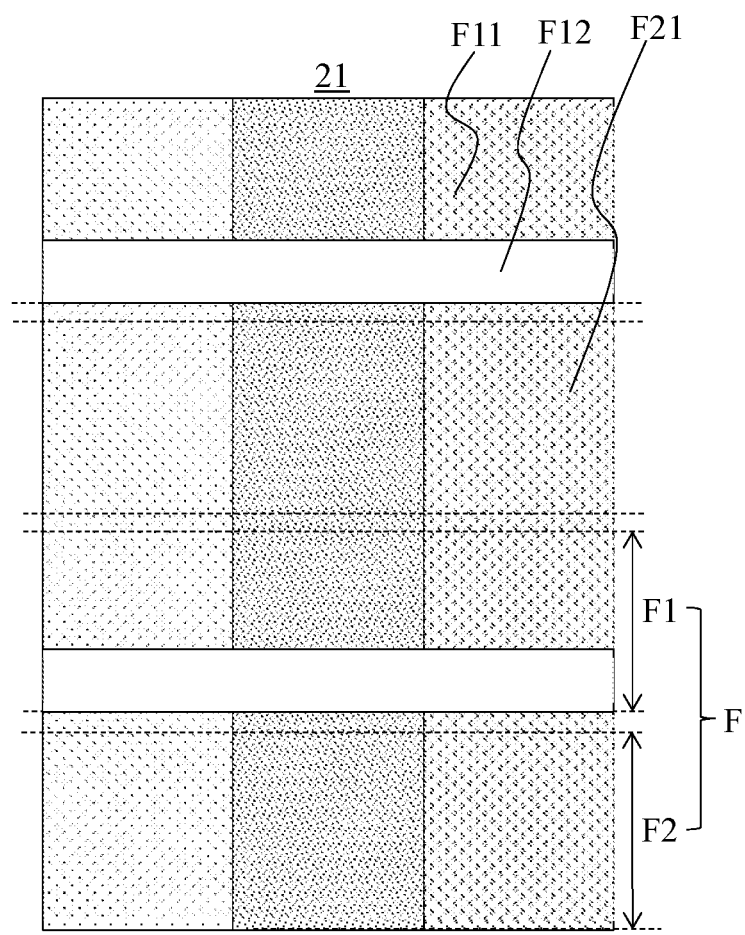
FIG. 6 illustrates an exemplary structure of a color filter layer consistent with disclosed embodiments.

Details of the color filter layer may be referred to FIG. 2, FIG. 3, and FIG. 6. FIG. 6 illustrates a structure of the color filter layer provided by an embodiment of the present disclosure. The color filter layer 21 may include a plurality of the color-blockers F with different color, and each of the color-blocker F may correspond to one of the pixels P arranged in an array. Each color-blocker F may include a first region F1 and an adjacent second region F2, corresponding to the first sub-pixel SP1 and the second sub-pixel SP2 in a same pixel P. The first region F1 and the second region F2 of one pixel P may belong to a same color-blocker and may have a same color.

At least the first region F1 may include a color-blocker region and a non-color-blocker region. In one embodiment, the first region F1 may include a first color-blocker region F11 and a first non-color-blocker region F12, while the second region may include a second color-blocker region F21. The first color-blocking region F11 may have an area different from an area of the second color-blocking region F21. Correspondingly, the area of the color-blocking region in the first region F1 and the area of the color-blocking region in the second region F2 may be different even if the area of the first region F1 and the area of the second region F2 is same. In one embodiment, the area of the second color-blocking region F21 in the second region F2 may be larger than the first color-blocking region F11 in the first region F1. The color-blocking region may refer to a region covered by or deposited with color-blockers in the color filter layer. The color-blocking region may attenuate (or absorb) light waves in a certain wavelength range of the incident light waves, or precisely allow light waves in a small wavelength range to transmit, by reflecting (absorbing) light waves with other wavelength. Correspondingly, the emitted light may have certain colors. For example, in a display device, white light emitted by a backlight module or natural light reflected by the reflective metal layer may emit red, green or blue lights according to needs of the display after passing through the color filter layer. The non-color-blocking region may refer to a region that cannot filter light and cannot emit lights with certain colors. The non-color-blocking region may be a region that is not covered by or deposited with color-blockers and may be a white-light-transmitting region. The non-color-blocking region may also be a region that cannot transmit any light, and may be formed by a metal layer or a black epoxy layer in the certain region.

A relationship between the area of the color-blocking region in the first region F1 and the area of the color-blocking region in the second region F2 may be determined by the needs of the display. For example, the area of the color-blocking region in the first region F1 may be denoted as S1, and the area of the color-blocking region in the second region F2 may be denoted as S2, where $\frac{1}{2} \leq S1/S2 \leq \frac{4}{5}$. Further, $S1/S2=\frac{1}{2}$ may be arranged, or the area of the color-blocking region in the second region F2 may be twice of the area of the color-blocking region in the first region F1. The present disclosure has no limit on the relationship between the area of the color-blocking region in the first region F1 and the area of the color-blocking region in the second region F2.

When displaying, a first pixel electrode Px1 in the first sub-pixel SP1 may be driven by the primary thin film transistor T0 and the first thin film transistor T1 according to signals from the first scanning line and the primary scanning line; or, a second pixel electrode Px2 in the second sub-pixel SP2 may be driven by the primary thin film transistor T0 and the second thin film transistor T2 according to signals from the second scanning line and the primary scanning line. Further, a voltage difference may be formed between the pixel electrodes and the common electrode according to signals from the data line, and may be used to drive changes of states of the liquid crystal molecules. Correspondingly, external lights incident from one side of the second substrate may incident on the reflective metal layer of the first substrate via the liquid crystal layer, and may be reflected to the liquid crystal layer through the reflective metal layer. Subsequently, the light may display images based on angles of the liquid crystal molecules in the liquid crystal layer. In the area of each sub-pixel in one pixel, the liquid crystal molecules may change the states, such as rotate and/or distortion, driven by the voltage difference formed between the pixel electrodes and the common electrode based on signals from the data line. This effect plus the polarization device on the base substrate may cause that the area of each sub-pixel may have two states including an on state and an off state. When the sub-pixel is in the off state, the lights reflected by the reflective metal layer cannot pass the area corresponding to this sub-pixel, and the area corresponding to this sub-pixel may display black; when the sub-pixel is in the on state, the lights reflected by the reflective metal layer can pass the area corresponding to this sub-pixel, and the area corresponding to this sub-pixel may display a color of the corresponding color-blocker. Each pixel may display black or other colors according to the images, by controlling data signals in the data lines connected to the pixel electrodes in sub-pixels.

In one embodiment, the first sub-pixel SP1 and the second sub-pixel SP2 in one pixel may be in the off state simultaneously, by controlling the voltage difference between the pixel electrodes and the common electrodes. The region of the first sub-pixel SP1 and the region of the second sub-pixel SP2 may display black simultaneously, and the corresponding pixel may display black. The first sub-pixel SP1 and the second sub-pixel SP2 in one pixel may be in the on state simultaneously, by controlling the voltage difference between the pixel electrodes and the common electrodes. The lights reflected by the reflective metal layer can pass the regions corresponding to the first sub-pixel SP1 and the second sub-pixel SP2, and the regions of the first sub-pixel SP1 and the area of the second sub-pixel SP2 may display a color of the corresponding color-blocking region, i.e., the first sub-pixel SP1 may display a color of the first color-blocking region S11 in the first color-blocker F1 and the second sub-pixel SP2 may display a color of the second color-blocking region S21 in the second color-blocker F2. The pixel may display a color which is a sum of the color in the first color-blocking region S11 and the color in the second color-blocking region S21. In one pixel, the first sub-pixel SP1 may be in the on state and the second sub-pixel SP2 may be in the off state, by controlling the voltage difference between the pixel electrodes and the common electrodes. The first sub-pixel SP1 may display a color of the first color-blocking region S11 in the first color-blocker F1, and the regions of the second sub-pixel SP2 may display black. The pixel may display a color of the first color-blocking region S11. In one pixel, the first sub-pixel SP1 may be in the off state and the second sub-pixel SP2 may be in the on state, by controlling the voltage difference between the pixel electrodes and the common electrodes. Further, the region of the second sub-pixel SP2 may display a color of the second color-blocking region S21 in the second color-blocker F2, and the regions of the first sub-pixel SP1 may display black. Further, the pixel may display a color of the second color-blocking region S21.

In the last three states above, although the color of the color-blocker corresponding to the first sub-pixel SP1 and the second sub-pixel SP2 is same, the amount of the light passing through the color-blocking region corresponding to the first sub-pixel may be different from the amount of the light passing through the color-blocking region corresponding to the second sub-pixel, because the areas of the second color-blocking region S21 in the second region F2 may be larger than the area of the first color-blocking region S11 in the first region F1. Correspondingly, the light passing through the color-blocker corresponding to the first sub-pixel and the second sub-pixel may have a different brightness and, thus, the human eyes may sense different colors. Thus, although the color of the color-blocker corresponding to the first sub-pixel SP1 and the color of the second sub-pixel SP2 is the same, the pixel where the first sub-pixel and the second sub-pixel is located may display different colors in the last three states. The amount of the light passing through the color-blocker corresponding to the pixel may be largest when both the first sub-pixel and the second sub-pixel in the pixel are in the on state, and the amount of the light passing through the color-blocker corresponding to the pixel may be smallest when the first sub-pixel is in the on state and the second sub-pixel is in the off state. Correspondingly, each pixel may at most display four different colors including black, a first color produced by lights only passing the first color-blocking region, a second color produced by lights only passing the second color-blocking region, and a mixing color by lights passing the first color-blocking region and the second color-blocking region simultaneously.

In the present disclosure, since the first sub-pixel and the second sub-pixel of a same pixel may have an approximately same area, only a high voltage and a low voltage may be used to control each sub-pixel to be in a bright state or in a dark state, to achieve a multi-color display. The power consumption of the driving circuit in the liquid crystal display panel may be reduced, and a multi-color display with ultra-low power consumption may be achieved. In the liquid crystal display panel provided by the present disclosure, the voltage corresponding to the brightest state and the darkest state may have a substantially small influence on the brightness, and the change in the brightness may be not sensitive to the change in the voltage. Correspondingly, even if the current leakage happens, the change in the brightness may be small, and driving with even lower frequency may be achieved, to further reduce the driving power consumption. The two sub-pixels in the liquid crystal display panel provided by the present disclosure may have approximately same storage capacitance or the liquid crystal capacitance. Correspondingly, when low-frequency current leakage happens, the two sub-pixels may have same current leakage and same common voltage. Thus, the flickering and afterimage problems may be avoided, and the display effect may be improved.

Figure 9:
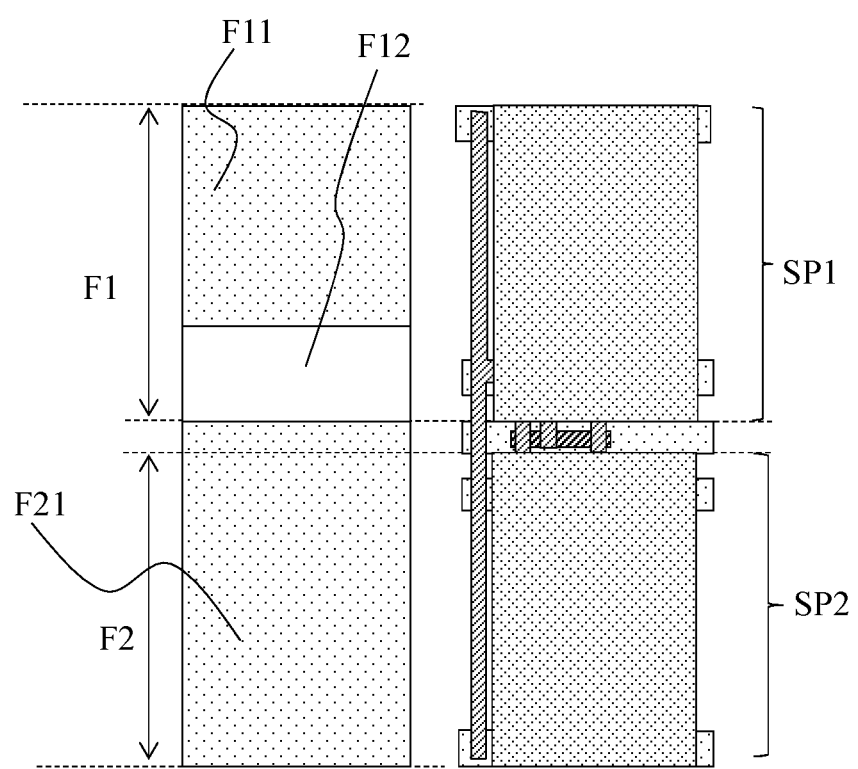
FIG. 9 illustrates another exemplary structure of a color-blocking layer in the color filter layer consistent with disclosed embodiments.
Figure 10:
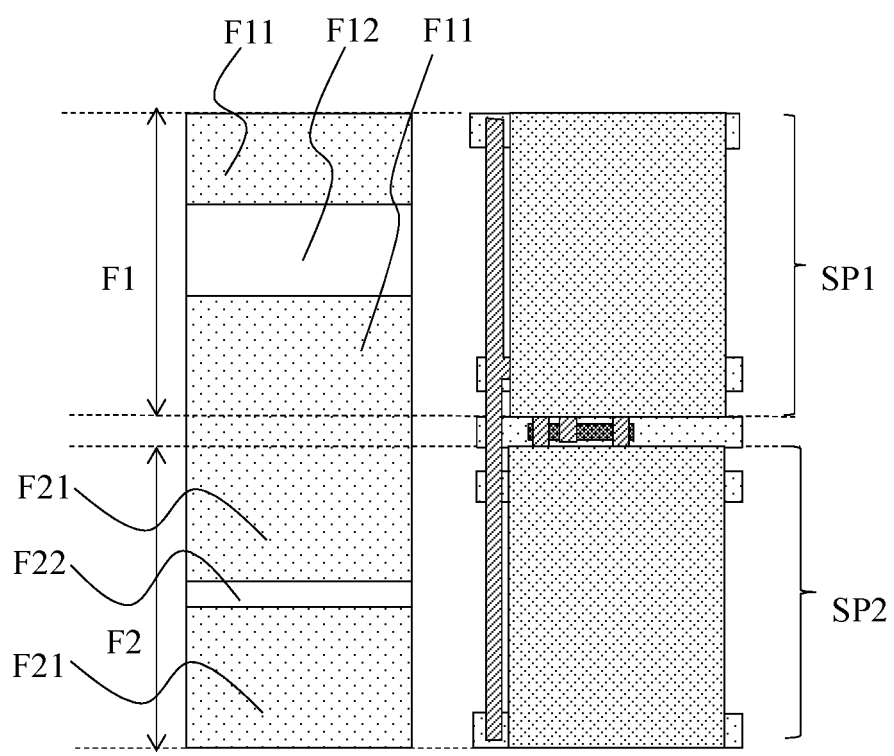
FIG. 10 illustrates another exemplary structure of a color-blocking layer in the color filter layer consistent with disclosed embodiments.
Figure 11:
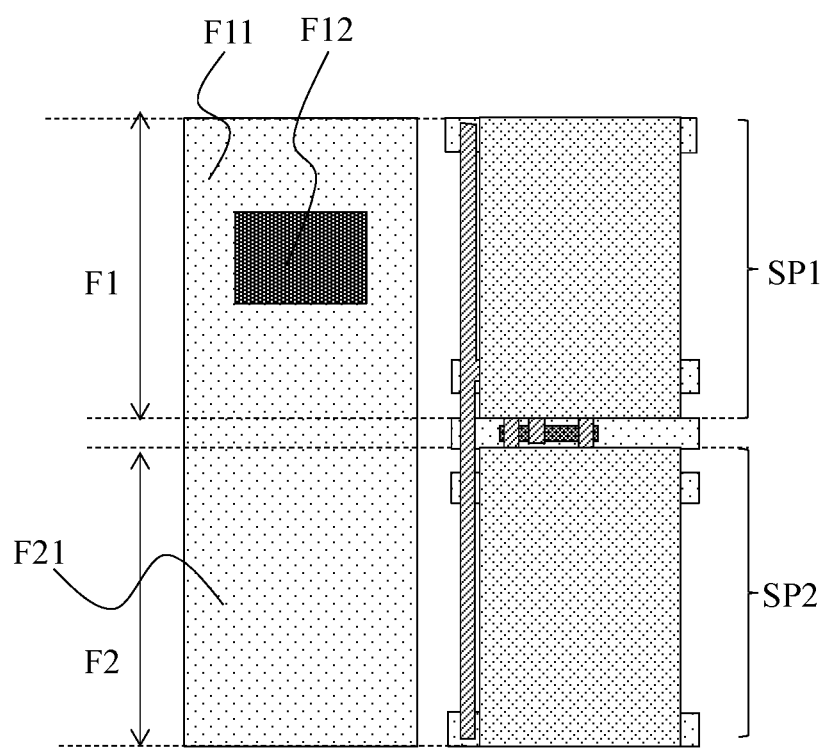
FIG. 11 illustrates another exemplary structure of a color-blocking layer in the color filter layer consistent with disclosed embodiments.

FIGS. 7-11 illustrate several different structures of the color filter layer consistent with various embodiments of the present disclosure. FIGS. 7-10 illustrate that openings or white-light-transmission areas may be deployed in the color filter layer, to form non-color-blocking regions, and the areas of the second color-blocking region S21 in the second region F2 may be larger than the area of the first color-blocking region S11 in the first region F1. For example, when forming the color filter layer by coating or color-vapor depositing, a portion of the regions may be not coated or covered, and the color-blockers may be only formed in the color-blocking regions. Thus, the opening regions transmitting white lights may be formed. FIG. 11 illustrates that light-shielding regions may be formed on the color filter layer to form the non-color-blocking regions, and the areas of the second color-blocking region S21 in the second region F2 may be larger than the area of the first color-blocking region S11 in the first region F1. Subsequently, since the first sub-pixel and the second sub-pixel of a same pixel may approximately have a same area, only a high voltage and a low voltage may be used to control each sub-pixel to be in a bright state or in a dark state, to achieve a four-color display.

Figure 7:
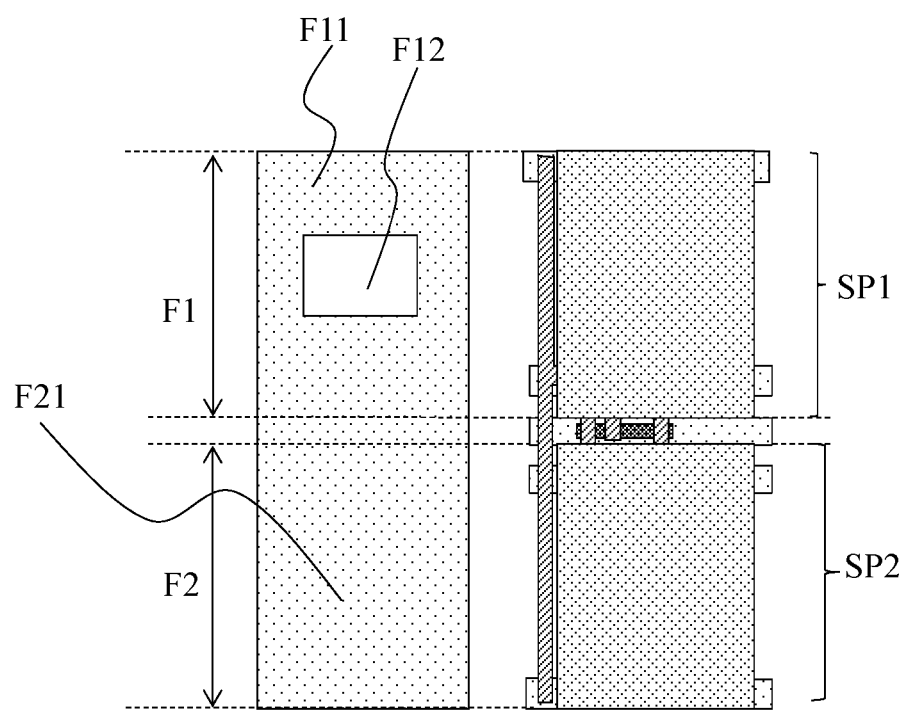
FIG. 7 illustrates an exemplary structure of a color-blocking layer in the color filter layer consistent with disclosed embodiments.

In one embodiment, referring to FIG. 7, the color filter layer may include a plurality of the color-blockers, and each color-blocker may include a first region F1 and a second region F2 adjacent to each other. The first region F1 and the second region F2 may correspond to the first sub-pixel SP1 and the second sub-pixel SP2 in a same pixel of the color-blocker. The first region F1 and the second region F2 may belong to a same color-blocker and may have a same color. The first region F1 may include a first color-blocking region and a primary opening region. The primary opening region, also called a hole region, where the color-blocker layer is not formed, may form a first non-color-blocking region F12. The primary opening region may be located in a middle of the first region F1. The whole second region F2 is the color-blocking region, and the second color-blocking region in the second region F2 may have an area larger than the first color-blocking region in the first region F1, although the first region F1 and the second region F2 may have an approximately same area. When forming the non-color-blocking regions by the opening regions, the multi-color display may be achieved and the transmission rate of the color filter layer may be enhanced simultaneously, and the display brightness may be improved.

In various embodiments, the area of the primary opening region or the first non-color-blocking region F12 may be configured according to actual requirements. For example, the area of the primary opening region or the first non-color-blocking region F12 may be half of the area of the first region F1. The area of the second color-blocking region in the second region F2 may be twice of the area of the first color-blocking region in the first region F1, because the first region F1 and the second region F2 may approximately have a same area.

Figure 8:
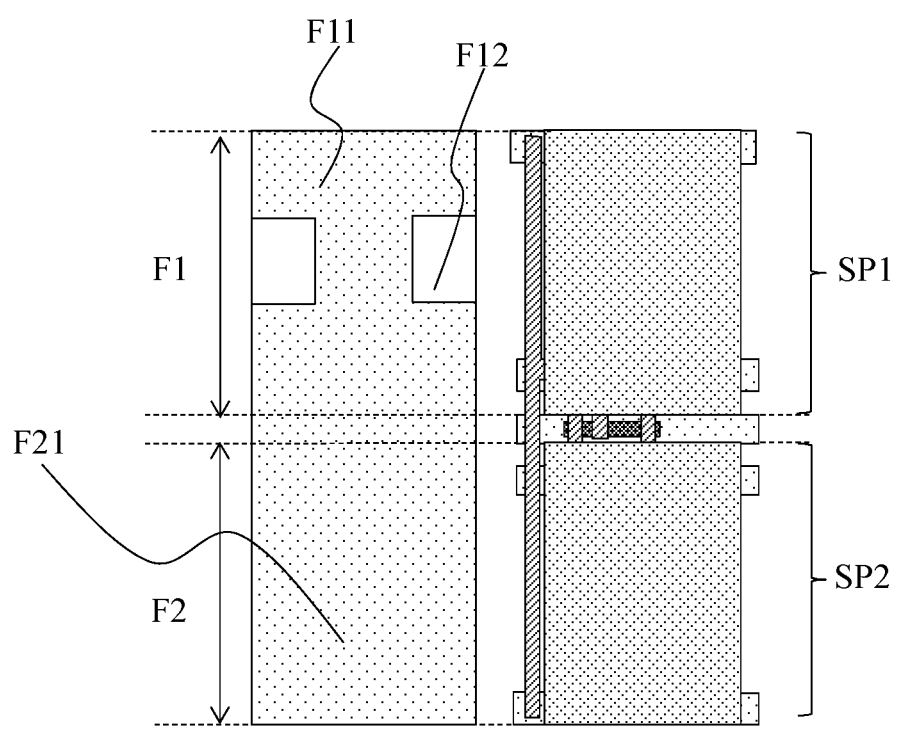
FIG. 8 illustrates another exemplary structure of a color-blocking layer in the color filter layer consistent with disclosed embodiments.

In another embodiment, referring to FIG. 8, the first region F1 may include a first color-blocking region and two primary opening regions. The two primary opening regions, also called hole regions, where the color-blocker layer is not formed, may form the first non-color-blocking region F12. The two primary opening regions may be located in two sides of the first region F1, to form the first color-blocking region F11 with a shape of "H". The whole second region F2 is the color-blocking region, and the second color-blocking region in the second region F2 may have an area larger than the first color-blocking region in the first region F1, although the first region F1 and the second region F2 may approximately have a same area.

In another embodiment, referring to FIG. 9, the first region F1 may include a first color-blocking region and a primary opening region. The primary opening region, also called a hole region, where the color-blocker layer is not formed, may form a first non-color-blocking region F12. The primary opening region may be located in one side the first region F1 close to the second region F2, or between the first color-blocking region F11 and the second color-blocking region F21. This arrangement may avoid a very narrow region in the first color-blocking region F11, and benefit the precision control when forming the color filter layer. The whole second region F2 is the color-blocking region, and the second color-blocking region in the second region F2 may have an area larger than the first color-blocking region in the first region F1. The first region F1 and the second region F2 may have an approximately same area.

In another embodiment, referring to FIG. 10, both the first region F1 and the second region F2 in each pixel may have an opening region, to improve the transmission rate of lights and the display brightness. The first region F1 may include a first color-blocking region and a primary opening region. The primary opening region may form a first non-color-blocking region F12. The second region F2 may include a second color-blocking region and an auxiliary opening region. The auxiliary opening region may form a second non-color-blocking region F21. The second non-color-blocking region F21 may have an area smaller than an area of the first non-color-blocking region F12, or the second color-blocking region in the second region F2 may have an area larger than the first color-blocking region in the first region F1. The color-blocking layer may be not formed in the primary opening region and in the auxiliary opening region, and may also be called as a hole region. In this embodiment, because both the first region and the second region may have an opening region, and the second color-blocking region in the second region F2 may have an area larger than the first color-blocking region in the first region F1, when forming the non-color-blocking regions by the opening regions, the multi-color display may be achieved and the transmission rate of the color filter layer may be enhanced further simultaneously. The display brightness may be improved further.

In another embodiment, referring to FIG. 11, the first region F1 may include a first color-blocking region F11 and a light-shielding region. The light-shielding region may form the first non-color-blocking region F12, and may be formed by deploying a metal thin film layer or a black epoxy material layer. The whole second region F2 is the color-blocking region, and the second color-blocking region in the second region F2 may have an area larger than the first color-blocking region in the first region F1. The first region F1 and the second region F2 may have an approximately same area.

Figure 12:
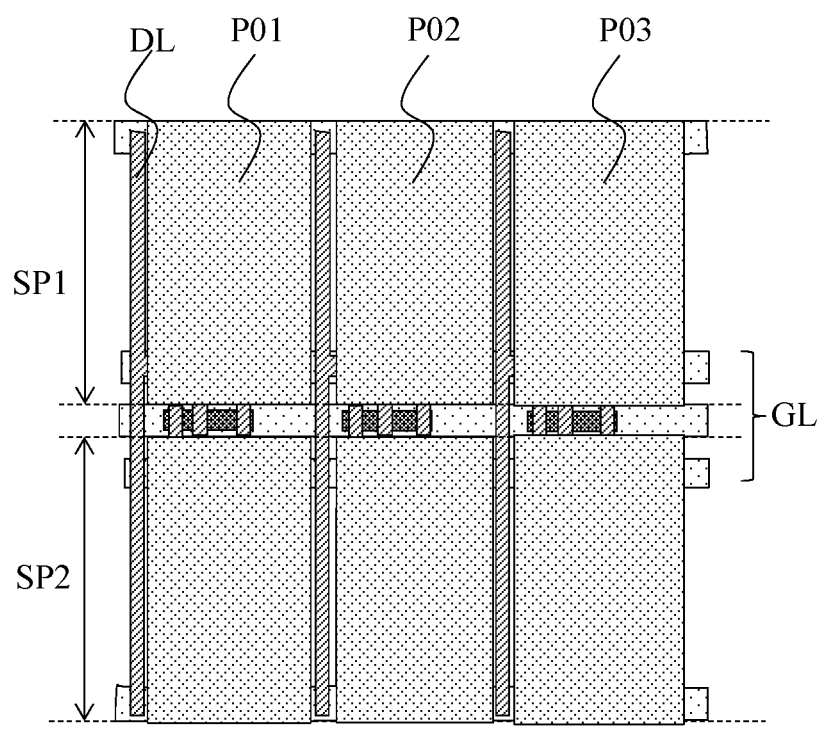
FIG. 12 illustrates another exemplary structure of a first substrate consistent with disclosed embodiments.
Figure 13:
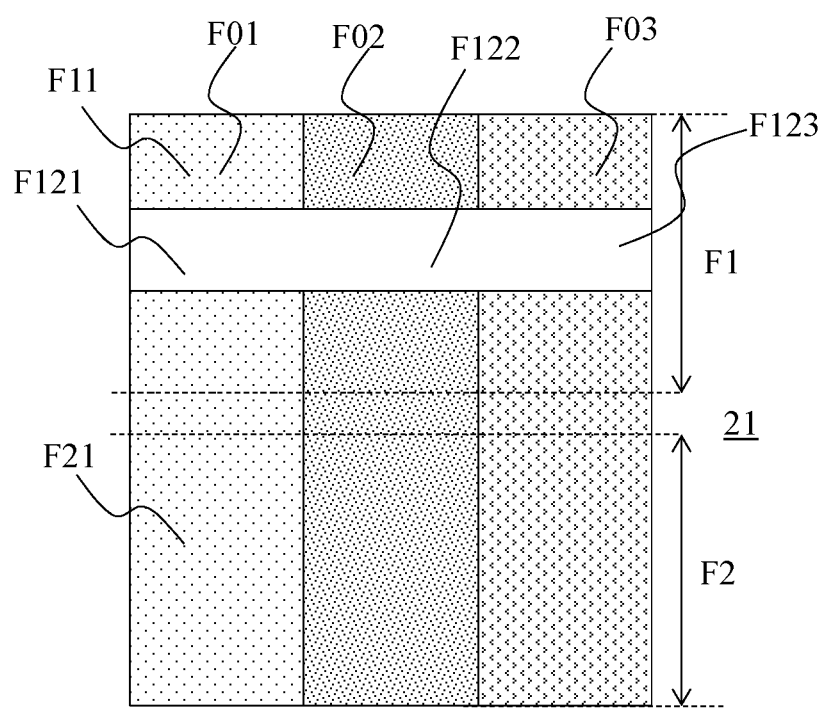
FIG. 13 illustrates another exemplary structure of a color-blocking layer in the color filter layer consistent with disclosed embodiments.

FIG. 12 and FIG. 13 illustrate a structure of the pixel array and the color filter layer provided by another embodiment of the present disclosure. Referring to FIG. 12, in the pixel array, a plurality of the pixels arranged in an array may at least include a first color pixel P01, a second color pixel P02, and a third color pixel P33. The first color pixel P01, the second color pixel P02, and the third color pixel P03 may be arranged along the extending direction of the scanning line GL. Referring to FIG. 13, the color filter layer 21 may include a first color-blocker F01, a second color-blocker F02 and a third color-blocker F03, which corresponds to the first color pixel P01, the second color pixel P02, and the third color pixel P03, respectively.

The color of the first color-blocker F01, the second color-blocker F02 and the third color-blocker F03 may be different from each other, and may be configured according to the needs of the display. For example, the color of the first color-blocker F01, the second color-blocker F02 and the third color-blocker F03 may be configured as three primary colors respectively, such as red, green and blue.

Further, each of the first color pixel P01, the second color pixel P02, and the third color pixel P03 may include the first sub-pixel SP1 and the second sub-pixel SP2 described above. The first pixel and the second pixel in one pixel may be arranged along the extending direction of the data line DL, and may correspond to a same color-blocker. A plurality of the first color pixel P01 may be arranged along the extending direction of the data line DL repeatedly. A plurality of the second color pixel P02 may be arranged along the extending direction of the data line DL repeatedly. A plurality of the third color pixel P03 may be arranged along the extending direction of the data line DL repeatedly. Correspondingly, the color filter layer may include a plurality of rows of color-blockers. Each row of the color-blockers may correspond to a plurality of first color pixel P01 in the same row, or each row of the color-blockers may correspond to a plurality of second color pixel P02 in the same row, or each row of the color-blockers may correspond to a plurality of third color pixels P03 in the same row.

The first region F1 of the first color-blocker F01 may include a color-blocking region (a first color-blocking region F11) and a first opening region F121. The first region F1 of the second color-blocker F02 may include a color-blocking region (a first color-blocking region F11) and a second opening region F122. The first region F1 of the third color-blocker F03 may include a color-blocking region (a first color-blocking region F11) and a third opening region F123. The first opening region F121, the second opening region F122, and the third opening region F123 may form the non-color-blocking region of the first color-blocker F01, the non-color-blocking region of the second color-blocker F02, and the non-color-blocking region of the third color-blocker F03, respectively. The first opening region F121, the second opening region F122, and the third opening region F123 may have an approximately same area. The whole second region of each color-blocker may be the color-blocking region (the second color-blocking region F21).

In one embodiment, the non-color-blocking region of each color-blocker (the first opening region F121, the second opening region F122, and the third opening region F123) may be located in a central position of the corresponding first region F1. The first opening region F121, the second opening region F122, and the third opening region F123 may be connected to each other. Edges of the first region F11 in the first color-blocker F01, edges of the first region F11 in the second color-blocker F02, and edges of the first region F11 in the third color-blocker F03 near the non-color-blocking regions may be flush with each other. The process for forming the color filter layer may be simplified, which may benefit the precision control. In each color blocker, the second color-blocking region in the second region F2 may have an area larger than the first color-blocking region in the first region F1.

Each pixel may at most display four different colors including black, a first color produced by lights only passing the first color-blocking region, a second color produced by lights only passing the second color-blocking region, and a mixing color by lights passing the first color-blocking region and the second color-blocking region simultaneously. Moreover, the pixel array of the first substrate may at least include a first color pixel, a second color pixel, and a third color pixel. When the first color pixel, the second color pixel, and the third color pixel correspond to different color-blockers with different colors, the first color pixel can display four different colors, the second color pixel can display four different colors, and the third color pixel can display four different colors. The four colors displayed by the first color pixel may be different from the four colors displayed by the second color pixel; the four colors displayed by the second color pixel may be different from the four colors displayed by the third color pixel; and the four colors displayed by the third color pixel may be different from the four colors displayed by the first color pixel. Correspondingly, in the liquid crystal display panel formed by the array substrate including the pixel array, 4*4*4=64 colors could be displayed by providing driving voltages corresponding the on and off states to the pixel electrodes. A plurality of gray scale voltages in the liquid crystal display panel may be avoided. Correspondingly, the power consumption may be lowered, and the design cost and production cost of the driving parts may be reduced.

Figure 14:
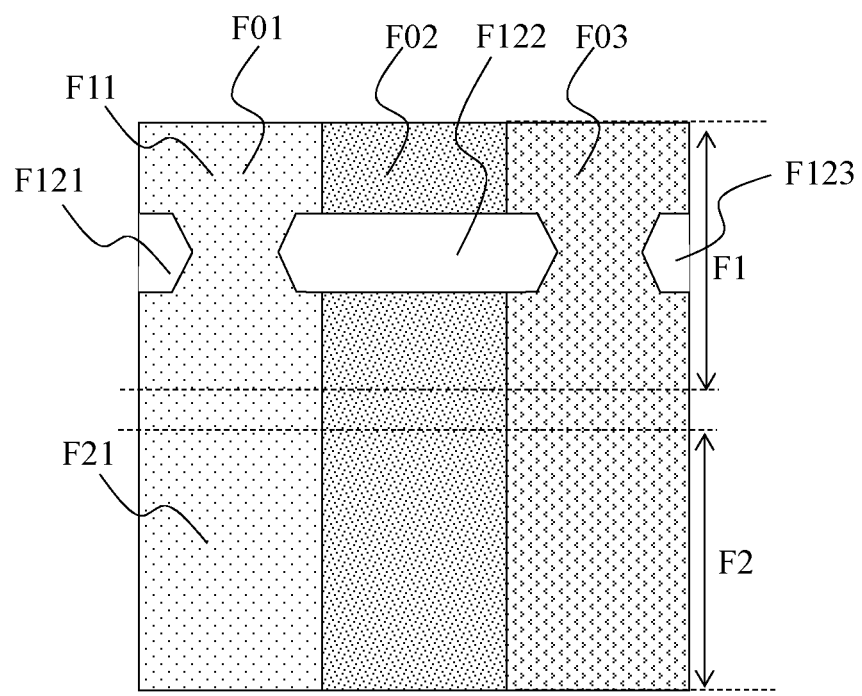
FIG. 14 illustrates another exemplary structure of a color-blocking layer in the color filter layer consistent with disclosed embodiments

FIG. 14 illustrates a structure of another color filter layer provided by another embodiment of the present disclosure. The structure of the color filter layer in the present embodiment may be same as the color filter layer in FIG. 13. Further, the non-color-blocking region in the first region of the second color-blocker F02 may have a shape different from the non-color-blocking region in the first region of the first color-blocker F01 and the non-color-blocking region in the first region of the third color-blocker F03. Also, the non-color-blocking region in the first region of the second color-blocker F02 may have an area different from the non-color-blocking region in the first region of the first color-blocker F01 and the non-color-blocking region in the first region of the third color-blocker F03.

In one embodiment, the non-color-blocking region of the first color-blocker F01 may include two first opening regions F121, and the non-color-blocking region of the third color-blocker F03 may include two third opening regions F123. The first opening regions F121 may have a shape of pentagon, and may be located on two sides of the first region F1 of the first color-blocker F01. The third opening regions F123 may have a shape of pentagon, and may be located on two sides of the first region F1 of the third color-blocker F03. The non-color-blocking region of the second color-blocker F02 may include a second opening region F122 in the middle of the first region F1 of the second color-blocker F02. One of the first opening regions F121 of the first color-blocker F01 close to the second color-blocker F02, one of the third opening regions F123 of the third color-blocker F03 close to the second color-blocker F02, and the second opening region F122 of the second color-blocker F02 may be connected to each other. The second region F2 of the first color-blocker F01, the second region of the second color-blocker F02, and the second region of the third color-blocker F03 totally is the color-blocking region.

A relationship between the size of the first region F1 and the size of the second region F2 in each pixel may be determined based on actual needs, and a relationship between the area of the color-blocking region in the first region F1 of the first color-blocker F01, the area of the color-blocking region in the first region F1 of the second color-blocker F02, and the area of the color-blocking region in the first region F1 of the third color-blocker F03 may be determined based on the colors of the three color-blockers respectively, to improve the display effect. In one embodiment, the area of the color-blocking region in the first region F1 of the second color-blocker F02 may be different from areas of the area of the color-blocking region in the first region F1 of other two color-blockers. Further, the area of the color-blocking region in the first region F1 of the second color-blocker F02, and the area of the color-blocking region in the first region F1 of the third color-blocker F03 may be different from each other.

In one embodiment, when the color of the first color-blocker F01, the second color-blocker F02, and the third color-blocker F03 is red, green, and blue, respectively, the second region F2 of the first color-blocker F01, the second region of the second color-blocker F02, and the second region of the third color-blocker F03 may all be the color-blocking region. The first region F1 of the first color-blocker F01, the first region of the second color-blocker F02, and the first region of the third color-blocker F03 may include a color-blocking region and an opening region. The opening region may form the non-color-blocking region of the first region. The area of the opening region (the non-color-blocking region) in the first region F1 of the second color-blocker F02 may be larger than the areas of the opening regions (the non-color-blocking regions) in the first regions F1 of other two color-blockers, since the green color-blocker may have a transmission rate for light higher than the red color-blocker and the blue color-blocker. Further, the relationship between the areas of the opening region (the non-color-blocking region) in the first region F1 of three color-blockers may adjust the transmission amount of lights for the red color-blocker, the green color-blocker, and the blue color-blocker, to balance a brightness of the first color pixel, a brightness of the second color pixel and a brightness of the third color pixel. The color shift problems such as a yellowish white may be alleviated.

In another embodiment, when the color of the first color-blocker F01, the second color-blocker F02, and the third color-blocker F03 is red, green and blue respectively, the second region F2 of the first color-blocker F01, the second region of the second color-blocker F02, and the second region of the third color-blocker F03 may all be the color-blocking regions. The first region F1 of the first color-blocker F01, the first region of the second color-blocker F02, and the first region of the third color-blocker F03 may include a color-blocking region and an opening region. The opening region may form the non-color-blocking region of the first region. The area of the opening region (the non-color-blocking region) in the first region F1 of the second color-blocker F02 may be larger than the area of the opening region (the non-color-blocking region) in the first region F1 of the first color-blocker F01, and the area of the opening region (the non-color-blocking region) in the first region F1 of the first color-blocker F01 may be larger than the area of the opening region (the non-color-blocking region) in the first region F1 of the third color-blocker F03.

In another embodiment, when the color of the first color-blocker F01, the color of the second color-blocker F02 and the color of the third color-blocker F03 are red, green and blue respectively, the first color-blocker F01, the second color-blocker F02, and the third color-blocker F03 may have a same area approximately. The second region F2 of the first color-blocker F01, the second region of the second color-blocker F02, and the second region of the third color-blocker F03 totally may be the color-blocking region. The first region F1 of the first color-blocker F01, the first region of the second color-blocker F02, and the first region of the third color-blocker F03 may include a color-blocking region and an opening region. The opening region may form the non-color-blocking region of the first region. The area of the opening region (the non-color-blocking region) in the first region F1 of the second color-blocker F02 may be about 28% of the total area of the corresponding first region. The area of the opening region (the non-color-blocking region) in the first region F1 of the first color-blocker F01 may be about 16% of the corresponding first region, and the area of the opening region (the non-color-blocking region) in the first region F1 of the third color-blocker F03 may be about 8% of the corresponding first region. Correspondingly, a low-power-consumption colorful display may be achieved, and a display brightness may be improved, while color shift problems such as a yellowish white may be alleviated simultaneously.

In another embodiment, when the color of the first color-blocker F01, the second color-blocker F02 and the third color-blocker F03 is red, green and blue respectively, the first color-blocker F01, the second color-blocker F02, and the third color-blocker F03 may have an approximately same area. The second region F2 of the first color-blocker F01, the second region of the second color-blocker F02, and the second region of the third color-blocker F03 totally may be the color-blocking region. The first region F1 of the first color-blocker F01, the first region of the second color-blocker F02, and the first region of the third color-blocker F03 may include a color-blocking region and an opening region. The opening region may form the non-color-blocking region of the first region. The area of the opening region (the non-color-blocking region) in the first region F1 of the second color-blocker F02 may be about 40% of the total area of the corresponding first region. The area of the opening region (the non-color-blocking region) in the first region F1 of the first color-blocker F01 may be about 20% of the corresponding first region, and the area of the opening region (the non-color-blocking region) in the first region F1 of the third color-blocker F03 may be about 20% of the corresponding first region. Correspondingly, a low-power-consumption colorful display may be achieved, and a display brightness may be improved, while color shift problems such as a yellowish white may be alleviated simultaneously.

In the above descriptions, the present disclosure is described by using the embodiments where the second region F2 of the first color-blocker F01, the second region of the second color-blocker F02, and the second region of the third color-blocker F03 totally may be the color-blocking region, as the exemplary. In other embodiments, the first region and the second region in each pixel may have opening regions simultaneously, as long as the area of the color-blocking region in the first region and the area of the color-blocking region in the second region is different from each other. The total area of the opening region (the non-color-blocking region) in the first region F1 of the second color-blocker F02 may be larger than the total area of the opening region (the non-color-blocking region) in the first region F1 of the first color-blocker F01, and the area of the total opening region (the non-color-blocking region) in the first region F1 of the first color-blocker F01 may be larger than or equal to the total area of the opening region (the non-color-blocking region) in the first region F1 of the third color-blocker F03.

In a reflective liquid crystal display panel, when the pixel electrodes corresponding to each sub-pixel are used as the reflective metal layer simultaneously or the reflective metal layer is not a full-surface structure, the reflective metal layer between the adjacent sub-pixels may have gaps with a certain width. The gaps of the reflective metal layer between the adjacent sub-pixels may be used as the constant dark areas to prevent color mixing between the adjacent sub-pixels. Correspondingly, black matrixes may become unnecessary in positions corresponding to the areas between the different color-blockers in the color filter layer. Each row of the color-blockers corresponding to each row of pixels may be an entire color-blocker area of the same color. The adjacent color-blockers may be in contact with each other. In other embodiments, the black matrix may be used to separate the color-blockers of different colors. The liquid crystal display panel may further include the black matrix for light shielding. The black matrix may be deployed on the color film substrate or on the array substrate. The black matrix may be arranged in an array, and may separate the different sub-pixels in one pixel or in the adjacent pixels, to prevent the color mixing.

In various embodiments, the color filter layer may be deployed on the second substrate or on the first substrate, and the present disclosure have no limit on the position of the color filter layer.

In a conventional colorful liquid crystal display panel, a driving integrated circuit is used to generate different driving voltages to drive the liquid crystal to display different gray scale. In a red (R), green (G), and blue (B) liquid crystal display panel, at least four gray scale voltages are needed to perform 64-color display. If lowering the frequency is used to reduce the driving power consumption, a serious current leakage may happen in the pixel, and the brightness of the middle gray scales may be abnormal which causes the abnormal color of the displayed images. In the present disclosure, the liquid crystal display panel uses a method of dividing the driving region in the pixel, and only a high voltage and a low voltage may be used to control each sub-pixel to be in a bright state or in a dark state, to achieve a multi-color display. The power consumption of the driving circuit in the liquid crystal display panel may be reduced, and a multi-color display with ultra-low power consumption may be achieved. The two sub-pixels in the liquid crystal display panel provided by the present disclosure may have approximately same storage capacitance, and the storage capacitance may be as same as the liquid crystal capacitance. Correspondingly, when low-frequency current leakage happens, the two sub-pixels may have same current leakage and same common voltage. The flickering and afterimage problems may be avoided, and the display effects may be improved. Moreover, in the liquid crystal display panel provided by the present disclosure, the voltage corresponding to the brightest state and the darkest state may have a very small effect on the brightness, and the change in the brightness may be not sensitive to the change in the voltage. Correspondingly, even if the current leakage happens, the change in the brightness may be small, and driving with even lower frequency may be achieved, to further reduce the driving power consumption.

In the above description, the reflective liquid crystal display panel is only used as an example to describe the method of dividing driving regions in the pixel provided by the present disclosure, and should not limit the scope of the present disclosure. For example, the liquid crystal display panel may be a half-reflective half-transparent liquid crystal display panel.

The present disclosure may also provide a display device including the liquid crystal display panel provided by various embodiments of the present disclosure described above.

The embodiments disclosed herein are exemplary only. Other applications, advantages, alternations, modifications, or equivalents to the disclosed embodiments are obvious to those skilled in the art and are intended to be encompassed within the scope of the present disclosure. Therefore, although the present disclosure has been described in detail through the above embodiments, the present disclosure is not limited to the above embodiments, and other equivalent embodiments which do not depart from concepts of the present disclosure should be included. The scope of the present disclosure is determined by the scope of the claims.

What is claimed is:
1. A liquid crystal display panel, comprising:
a first substrate; and
a color filter layer,
wherein:
the first substrate includes a plurality of data lines and a plurality of scanning lines;
the color filter layer includes a plurality of color-blockers;
the data lines and the scanning lines intersect to form a plurality of pixels arranged in an array;
each pixel includes a first sub-pixel and a second sub-pixel adjacent to each other;
each first sub-pixel includes a first pixel electrode;
each second sub-pixel includes a second pixel electrode;
the second sub-pixel has an area approximately same as an area of the first sub-pixel;
each color-blocker corresponds to one of the pixels arranged in an array;
each color-blocker includes a first region and a second region, corresponding to the first sub-pixel and the second sub-pixel in a same pixel;
the second region has a color same as a color of the first region; and
the second region has a color-blocking region larger than a color-blocking region in the first region,
wherein:
the area of the color-blocking region in the second region is about twice of the area of the color-blocking region in the first region;
the first region includes a color-blocker region and a primary opening region;
the second region includes a color-blocker region and an auxiliary opening region; and
the primary opening region has an area larger than an area of the auxiliary opening region; and the primary opening region is located in a middle of the color-blocker region of the first region; or between the color-blocker region of the first region and the color-blocker region of the second region.

2. The liquid crystal display panel according to claim 1, wherein:
an area of the color-blocking region in the first region is denoted as S1;
an area of the color-blocking region in the second region is denoted as S2; and
½≤S1/S2≤⅘.

3. The liquid crystal display panel according to claim 2, wherein:
the plurality of pixels arranged in an array further includes first color pixels, second color pixels and third color pixels;
the first color pixels, the second color pixels and the third color pixels have approximately same areas;
a plurality of the color-blockers includes a first color-blocker, a second color-blocker and a third color-blocker, corresponding to the first color pixels, the second color pixels and the third color pixels;
the first color-blocker, the second color-blocker and the third color-blocker have different colors from each other; and
in one of the first color-blocker, the second color-blocker, and the third color-blocker, the color-blocker region of the first region has an area different from areas of the color-blocker regions of the first regions in other two color-blockers.

4. The liquid crystal display panel according to claim 3, wherein:
colors of the first color-blocker, the second color-blocker, and the third color-blocker are red, green, and blue, respectively.

5. The liquid crystal display panel according to claim 4, wherein:
the first regions of the first color-blocker, the second color-blocker, and the third color-blocker each includes a color-blocker region and an opening region;
the second region of the first color-blocker, the second region of the second color-blocker and the second region of the third color-blocker, all are color-blocker regions; and
the opening region of the second color-blocker has an area larger than an area of the opening region of the first color-blocker and an area of the opening region of the third color-blocker.

6. The liquid crystal display panel according to claim 4, wherein
the area of the opening region of the first color-blocker is larger than the area of the opening region of the third color-blocker.

7. The liquid crystal display panel according to claim 4, wherein
the area of the opening region of the second color-blocker is about 28% of a total area of the first region where the opening region is located.

8. The liquid crystal display panel according to claim 4, wherein:
the area of the opening region of the first color-blocker is about 16% of a total area of the first region where the opening region is located; and
the area of the opening region of the third color-blocker is about 8% of a total area of the first region where the opening region is located.

9. The liquid crystal display panel according to claim 4, wherein
the area of the opening region of the second color-blocker is about 40% of a total area of the first region where the opening region is located.

10. The liquid crystal display panel according to claim 9, wherein:
the area of the opening region of the first color-blocker is about 20% of a total area of the first region where the opening region is located; and
the area of the opening region of the third color-blocker is about 20% of a total area of the first region where the opening region is located.

11. The liquid crystal display panel according to claim 3, wherein:
the second color-blocker includes a second primary opening region at a middle of the first region of the second color-blocker;
the first color-blocker includes two first primary opening regions at two sides of the color-blocker region of the first color-blocker; and
the third color-blocker includes two third primary opening regions at two sides of the color-blocker region of the third color-blocker.

12. The liquid crystal display panel according to claim 1, further including:
a second substrate, comprising the color filter layer and common electrodes; and
a liquid crystal layer between the first substrate and the second substrate.

13. The liquid crystal display panel according to claim 12, wherein:
the first substrate further includes a reflective metal layer on one side of the first pixel electrode and the second pixel electrode toward the liquid crystal layer; and
the first pixel electrode and the second pixel electrode is used as the reflective metal layer simultaneously.

14. The liquid crystal display panel according to claim 12, wherein:
the first sub-pixel and the second sub-pixel are arranged along an extending direction of the data lines;
each scanning line includes a first scanning line between the first sub-pixel and the second sub-pixel, and a primary scanning line;
each pixel includes a primary thin film transistor and a first thin film transistor;
a source of the primary thin film transistor is connected to a corresponding data line;
a gate of the primary thin film transistor is connected to a corresponding primary scanning line;
a gate of the first thin film transistor is connected to a corresponding first scanning line;
a source of the first thin film transistor is connected to a first drain of the primary thin film transistor; and
a drain of the first thin film transistor is connected to the first pixel electrode.

15. The liquid crystal display panel according to claim 1, wherein:
the first region includes two primary opening regions which are located on two sides of the color-blocker region of the first region respectively.

16. The liquid crystal display panel according to claim 1, wherein:
the first region includes the color-blocker region and a color-shielding region.

17. A liquid crystal display panel, comprising:
a first substrate;

a color filter layer;
a second substrate, comprising a color filter layer and common electrodes; and
a liquid crystal layer between the first substrate and the second substrate,
wherein:
the first substrate includes a plurality of data lines and a plurality of scanning lines;
the color filter layer includes a plurality of color-blockers;
the data lines and the scanning lines intersect to form a plurality of pixels arranged in an array;
each pixel includes a first sub-pixel and a second sub-pixel adjacent to each other;
each first sub-pixel includes a first pixel electrode;
each second sub-pixel includes a second pixel electrode;
the second sub-pixel has an area approximately same as an area of the first sub-pixel;
each color-blocker corresponds to one of the pixels arranged in an array;
each color-blocker includes a first region and a second region, corresponding to the first sub-pixel and the second sub-pixel in a same pixel;
the second region has a color same as a color of the first region; and
the second region has a color-blocking region larger than a color-blocking region in the first region,
wherein:
the first sub-pixel and the second pixel are arranged along an extending direction of the data lines;
each scanning line includes a first scanning line between the first sub-pixel and the second pixel, and a primary scanning line;
each pixel includes a primary thin film transistor and a first thin film transistor;
a source of the primary thin film transistor is connected to a corresponding data line;
a gate of the primary thin film transistor is connected to a corresponding primary scanning line;
a gate of the first thin film transistor is connected to a corresponding first scanning line;
a source of the first thin film transistor is connected to a first drain of the primary thin film transistor; and
a drain of the first thin film transistor is connected to the first pixel electrode,
wherein:
each scanning line further includes a second scanning line between the first sub-pixel and the second sub-pixel;
each pixel further includes a second thin film transistor;
a gate of the second thin film transistor is connected to the second scanning line;
a source of the second thin film transistor is connected to a second drain of the primary thin film transistor; and
a drain of the second thin film transistor is connected to the second pixel electrode.

18. The liquid crystal display panel according to claim 17, wherein
the primary thin film transistor, the first film transistor, and the second film transistor each is a metal-oxide film transistor.

19. The liquid crystal display panel according to claim 17, wherein
the primary thin film transistor, the first film transistor, and the second film transistor each is an indium gallium zinc-oxide film transistor.

* * * * *